US005241132A

United States Patent [19]

McCormack

[11] Patent Number: 5,241,132

[45] Date of Patent: Aug. 31, 1993

[54] ELECTROMAGNETICALLY SHIELDED DOOR

[75] Inventor: Ray G. McCormack, St. Joseph, Ill.

[73] Assignee: The United States of America as represented by the Secretary of the Army, Washington, D.C.

[21] Appl. No.: 543,018

[22] Filed: Jun. 22, 1990

[51] Int. Cl.[5] .......................... H05K 9/00; E06B 7/16

[52] U.S. Cl. ............................ 174/35 MS; 174/35 R; 49/483.1

[58] Field of Search .......... 174/35 R, 35 MS, 35 GC; 219/10.55 D, 10.55 R; 361/424; 277/227, 228, 235 R, 234, 901; 49/478, 483, 479, 485

[56] References Cited

U.S. PATENT DOCUMENTS

| | | | |
|---|---|---|---|
| 2,978,531 | 4/1961 | Appleman | 174/35 MS |
| 3,260,788 | 7/1966 | Stetson | 174/35 GC |
| 3,962,550 | 6/1976 | Kaiserwerth | 174/35 GC |
| 4,069,618 | 1/1978 | Geiss | 49/483 |

*Primary Examiner*—Leo P. Picard
*Assistant Examiner*—Bot L. Ledynh
*Attorney, Agent, or Firm*—Darrell E. Hollis

[57] ABSTRACT

A shielding connecting structure is disclosed for permitting the opening and closing of the electromagnetic seal of screening material as applied across a door and a door jamb wherein the screening material is attached to the jamb and applied along the door. A pair of compressible parallel oriented rubber hoses are mounted between the jamb and the material attached thereto and a single compressible rubber hose is mounted between the door frame and the material applied thereto. The hose on the door is arranged to be positioned between the two parallel hoses when the door is closed upon the jamb during which the hoses become compressed to produce a wiping contacting action between the associated portions of the material.

7 Claims, 1 Drawing Sheet

ELECTROMAGNETICALLY SHIELDED DOOR

STATEMENT OF GOVERNMENT INTEREST

The invention described and claimed herein may be manufactured and used by or for the Government of the United States of America for governmental purposes without the payment of royalties thereon or therefor.

BACKGROUND OF THE INVENTION

This invention relates to electrically shielded door structures and, more particularly, to an electrical connection for use in shielded rooms which will insure electrical continuity of the shielding material relative to doors and doorways for the rooms.

Screen rooms are commonly used for shielding against extraneous radiations, especially electromagnetically radiations, in order to protect very sensitive materials or to eliminate the effects of such radiation upon testing equipment. Such rooms may employ screening material such as copper applied to the walls, ceiling and floor, and to other structural components of a room which may be a cause of intrusion by radiation. With respect to doors and related doorway frames, a particular problem arises because of the continuous use of a door to permit ingress and egress relative to the room and the consequent breaking and remaking of the electrical contacts provided in the screen material associated with the door.

Therefore, it is the principal object of the invention to insure complete electrical integrity of shielding material utilized in an electromagnetically shielded room.

Another object of the invention is to minimize or eliminate resistance buildup caused by required opening and closing of electromagnetically shielded doors.

These and other objects and advantages will become apparent after reading the following description in conjunction with the accompanying drawings.

DESCRIPTION OF THE PREFERRED EMBODIMENT

Figure 1:
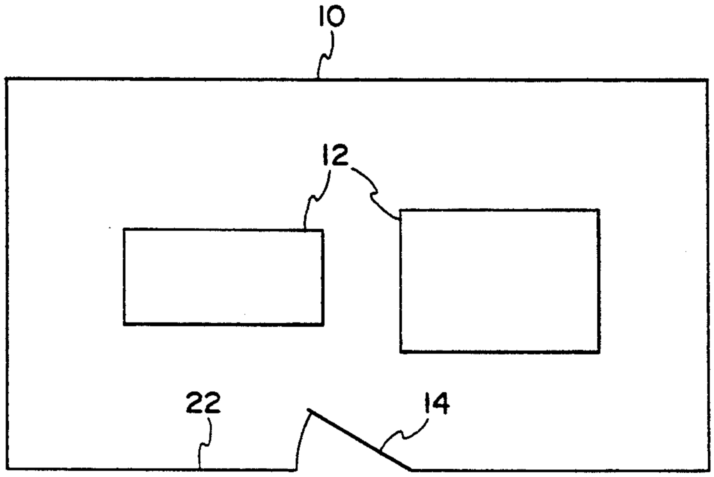
FIG. 1 is a plan view of a screened room which is illustrative of an environment for the present invention.

As an environment for the present invention, FIG. 1 illustrates a room 10 around which metallic shielding material (not shown) is mounted internally for securing contents 12 in the room. The shielding material may be used to isolate the contents from extraneous radiations. For example, the contents 12 may be highly sophisticated testing equipment or standards, and there is need to prevent the effects o electromagnetic radiations during their use or storage. The room 10 is typically furnished with one or more doors 14 for permitting the ingress and egress of personnel and equipment.

The present invention is concerned with maintaining the conductive integrity of the shielding material across the door 14 resulting from periodic opening and closing by personnel. In order to utilize the door, the shielding material must be breached and an arrangement is imperative which insures that upon closing, the full conductive effect of the shielding material around the room is restored.

Figure 2:
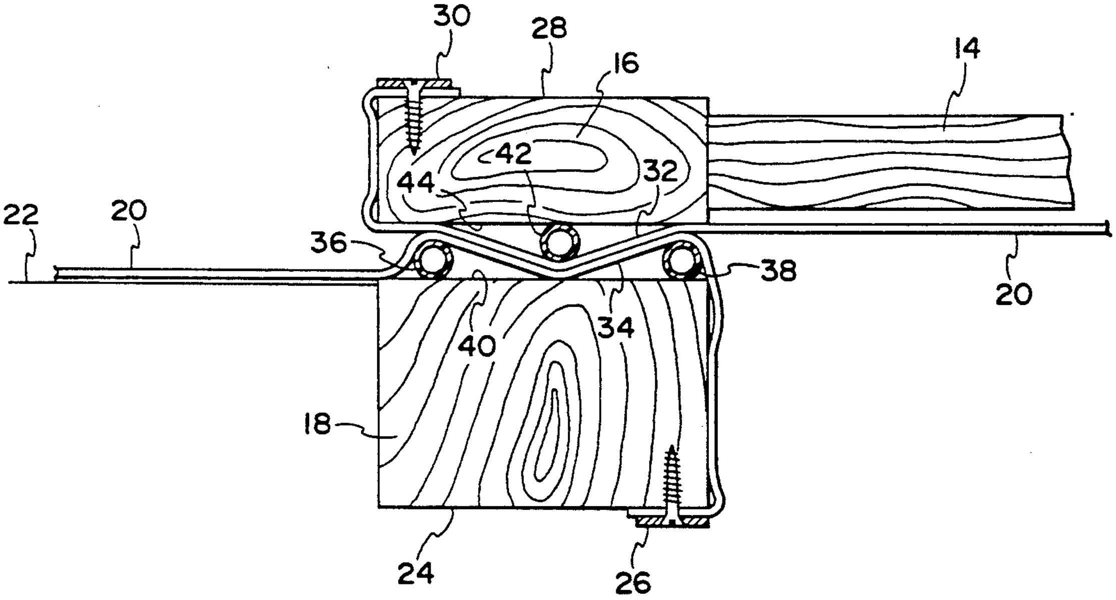
FIG. 2 is a fragmentary, cross-sectional view of a door frame and door jamb incorporating the present invention.

As shown in FIG. 2, the door 14 is shown as having a door frame member 16 cooperable with a door jamb 18 for the door frame which supports the door. A shielding material 20 is shown as applied to the wall 22 at which the door 14 is mounted. The material 20, which may be wire mesh screening material or a solid shielding membrane, completely encircles the room and is applied around door jamb 18 and terminates on the outside surface 24 of the jamb by suitable screws 26.

To complete the encirclement of the room, the material 20 is applied across the door 14, around the frame 16 and terminates on the inside surface 28 thereof by suitable screws 30. In this arrangement, the frame 28 of the door, when closed, is opposite the door jamb 18 wherein a section 32 of the material 20 on the frame 28 will be in contact with a section 34 of the material applied to the jamb. It will be understood that the sections 32 and 34 ar similarly applied along the frame 28 for the four sides of the door and likewise for the jamb of the doorway.

A pair of spaced and parallel-oriented compressible rubber hoses 36, 38, are maintained on the inner side 40 of the jamb 18 between the side 40 and the section 34 of the shielding material 20. The effect of this arrangement causes the section 32 to project outwardly toward the frame 16. A similar compressible rubber hose 42 is maintained on the outer side 44 of the frame 16 between side 44 and the shielding section 32 to produce an outward projection of the material. The hose 42 is positioned so as to be parallel to and generally equidistant from the hoses 36, 38.

After closure of the door 14, the hose 42 and adjacent portions of the section 32 project into the shielding section 34 between the hoses 36, 38, as shown in FIG. 2. In this arrangement, a substantial length of shielding material is placed in intimate overlapping contact, thus maintaining electrical conductivity of the shielding material across the door 14. However, the purposes of the hoses 36, 38, and 42 are to apply compression pressure on the shielding material 20 to assure electrical contact between the portion of the material on the door and the portion of the material on the doorway.

Complete electrical contact between the material sections 32 and 34 is assured because during closing of the door, the compression of the hoses and the consequent deforming of the associated shielding material will cause some movement there between, thereby effecting a wiping action of metallic material on metallic material. This wiping action assures low electrical contact resistance between these sections of material. In effect, these sections 32, and 34 of the shielding material during opening and closing of the door 14 function as an electrical switch whereby an electrical connection is opened and closed in accordance with the movement of the door.

Another significant advantage of the invention is that the hoses allow for irregularities in the construction of the door and doorway frame thereby eliminating the need for close tolerances. It will also be appreciated that the present arrangement for the intended purposes is relative simple and inexpensive, both in materials and labor, and is highly amendable to repair or replacement.

While the invention has been discussed with reference to the structure disclosed, it is not confined to the details set forth but is intended to cover such modifications or changes as may come within the scope of the appended claims.

What is claimed is:

1. A shielding structure for a door frame mounted on a wall and a door jamb cooperable therewith creating a doorway comprising shielding means mounted on the wall and having a section along a side of the jamb of the doorway, said shielding means being mounted along a side of the door frame and having a section adapted to contact said section on the jamb when the door is closed, first compressible means held between said side of the jamb and said section therealong, second compressible means held between said side of the door frame and said section therealong, said first and second compressible means being adapted to be compressed when the door is closed against the jamb and to produce a wiping action against said sections during closing of the door.

2. The structure as defined in claim 1 wherein said shielding means is an electrically conductive screen material.

3. The structure as defined in claim 1 wherein said shielding mean sis an electrically conductive solid membrane.

4. The structure as defined in claim 1 wherein said first and second compressible means are rubber hoses.

5. The structure as defined in claim 1 wherein one of said compressible means includes two parallel oriented rubber hoses.

6. The structure as defined in claim 5 wherein said other of said compressible means is a rubber hose arranged to be positioned between said two hoses of said one of said compressible means when the door is in a closed position.

7. A switching device for two ends of metallic screening material for opening and closing electrical conductivity therebetween, comprising a first member having a side against which one end of the material is held, a second member having a side against which the other end of the material is held, a first compressible means held between said side of said first member and said one end of the material, a second compressible means held between said side of said second member and said other end of the material, said first and second compressible means being adapted to be compressed when said second member is moved against said first member and to produce a wiping action against the ends of the screening material.

* * * * *